United States Patent
Moriya

(10) Patent No.: US 6,965,112 B2
(45) Date of Patent: Nov. 15, 2005

(54) SPECIMEN HOLDER, OBSERVATION SYSTEM, AND METHOD OF ROTATING SPECIMEN

(75) Inventor: Koji Moriya, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 10/843,696

(22) Filed: May 11, 2004

(65) Prior Publication Data

US 2005/0092933 A1    May 5, 2005

(30) Foreign Application Priority Data

May 12, 2003  (JP)  ............................. 2003-132542

(51) Int. Cl.[7] .............................................. G21K 5/08
(52) U.S. Cl. ................................ 250/442.11; 250/311
(58) Field of Search ........................ 250/442.11, 311, 250/440.11

(56) References Cited

U.S. PATENT DOCUMENTS 4,170,737 A  * 10/1979  Bobrov et al. ......... 250/442.11

FOREIGN PATENT DOCUMENTS

JP    11-185686    7/1999

* cited by examiner

Primary Examiner—Kiet T. Nguyen

(74) Attorney, Agent, or Firm—The Webb Law Firm

(57) ABSTRACT

There is disclosed a method of efficiently rotating a specimen without hindrance to observation of the specimen. A specimen holder having a holder body and a specimen-holding member is used. The holder body has a hole in which a step surface is formed. The specimen-holding member is supported from the step surface in the hole of the holder body and positioned within the hole. Arc-shaped slots are formed in the step surface. The specimen-holding member has an opening that accommodates the specimen. The specimen-holding member also has a surrounding portion through which rod-like members extend. The rod-like members have lower-end portions inserted in the slots formed in the step surface. The rod-like members also have upper-end portions. The specimen-holding member holding the specimen is rotated by rotating the upper-end portions of the rod-like members.

8 Claims, 7 Drawing Sheets

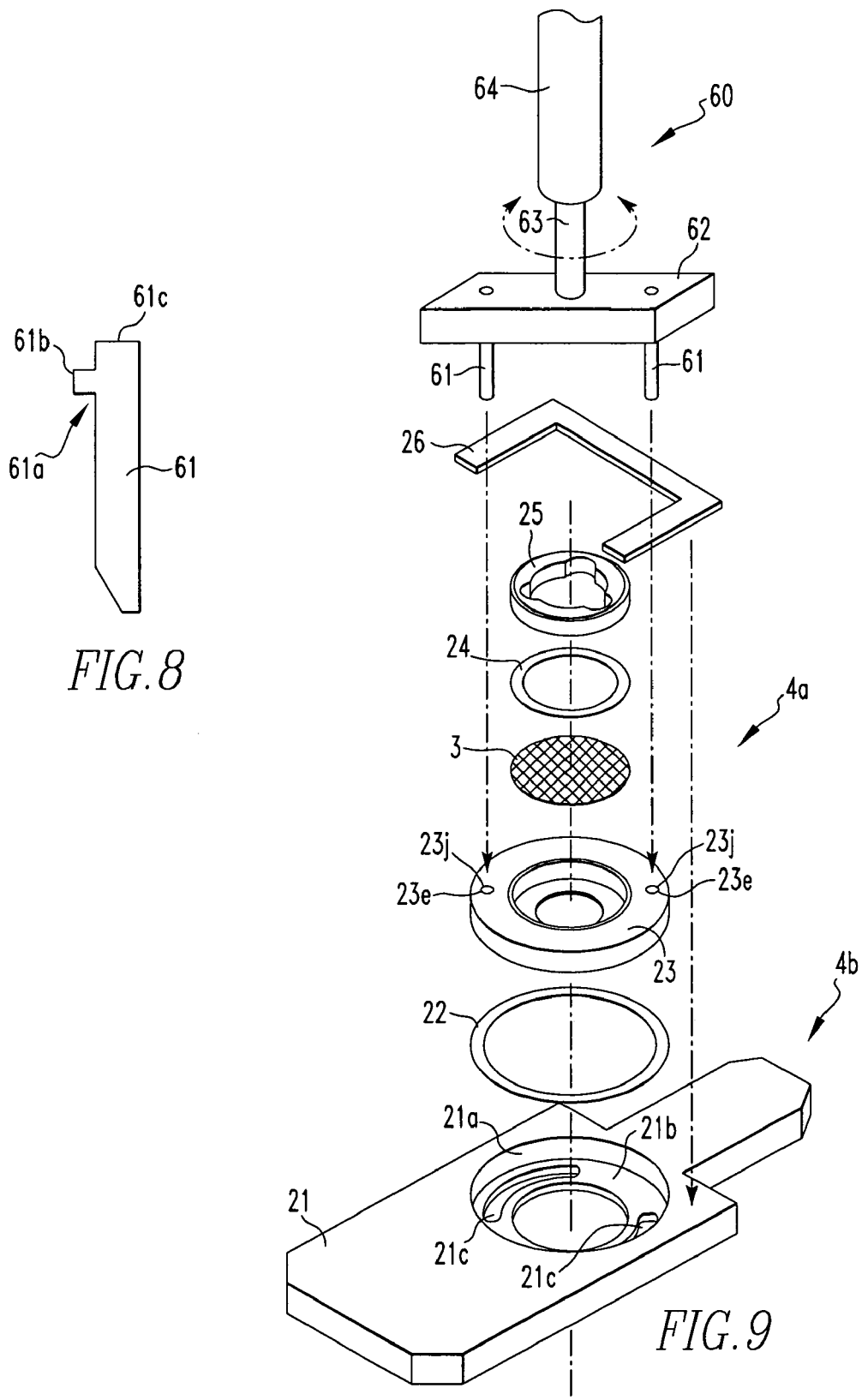

SPECIMEN HOLDER, OBSERVATION SYSTEM, AND METHOD OF ROTATING SPECIMEN

BACKGROUND OF THE INVENTION

1. Field of the Invention

The present invention relates to a specimen holder used in an observation system, such as a transmission electron microscope. The invention also relates to the observation system and to a method of rotating a specimen.

2. Description of Related Art

A transmission electron microscope has a microscope column in which electron optics are positioned. In some instruments, a goniometer (goniostage) supporting a specimen holder used to hold a specimen is mounted in the microscope column. A specimen exchange chamber is mounted in a position opposite to the goniometer. In this case, this specimen exchange chamber is fitted with a transport device for transporting the specimen holder into the microscope column.

The structure of such a transmission electron microscope is schematically shown in FIG. 10, where the microscope or an observation system is generally indicated by reference numeral 1. This microscope 1 has an electron gun 14 for emitting and accelerating an electron beam 12, which is controlled by an illumination lens 2 and directed at a specimen 3. The specimen 3 is held on a specimen holder 4 which is supported by the support portion 5a of a holder support device 5.

The electron beam 12 directed at the specimen 3 and then transmitted through it is focused onto film 8 or image pickup means 13 consisting of a CCD camera 11 under control of an imaging lens 6. The image pickup means 13 can take and record a transmission image created from the specimen 3 by the electron beam 12. A fluorescent screen 7 is placed off the optical axis of the beam 12 during imaging.

The electron gun 14, illumination lens 2, holder support device 5, and imaging lens 6 are positioned in the microscope column 15. A specimen exchange chamber 9 is mounted at a side of the microscope column 15 and located opposite to the holder support device 5. A specimen exchange device 10 having an exchange rod 10a for transporting the specimen holder 4 into the microscope column 15 is mounted in the specimen exchange chamber 9. The inside of the microscope column 15 and the inside of the specimen exchange chamber 9 can be pumped down to a given degree of vacuum by vacuum pumping systems (not shown).

One example of the transmission electron microscope constructed in this way is described, for example, in Japanese Patent Laid-Open No. H11-185686.

With the transmission electron microscope 1 having the construction described above, the specimen 3 held on the specimen holder 4 is observed under given conditions. This is hereinafter referred to as the first observation. Then, the specimen 3 may be rotated through a given angle (e.g., 90°) and observed again. This is hereinafter referred to as the second observation.

When the first observation is performed, the specimen holder 4 on which the specimen 3 is held is first transported to a front-end portion of the exchange rod 10a of the specimen exchange device 10 mounted within the specimen exchange chamber 9. Thereafter, the specimen exchange device 10 is manually manipulated by the operator to move the front-end portion of the exchange rod 10a into the microscope column 15. As a result, the specimen holder 4 at the front-end portion of the rod 10a is transported into the microscope column 15. Inside the column 15, the holder is moved onto the support portion 5a of the holder support device 5 and held there. Then, the exchange rod 10a of the specimen exchange device 10 is pulled back, and the front-end portion of the exchange rod 10a is returned into the specimen exchange chamber 9. Subsequently, within the microscope column 15, the electron beam 12 is directed at the specimen 3 under given conditions and the first observation is performed.

After carrying out the first observation, the second observation is made as follows. First, the specimen exchange device 10 is manipulated to move the front-end portion of the exchange rod 10a into the microscope column 15. In this column 15, the specimen holder 4 supported on the support portion 5a of the holder support device 5 is transported onto the front-end portion of the exchange rod 10a. Then, the rod 10a is pulled back, and the front-end portion of the rod 10a is returned into the specimen exchange chamber 9. Thus, the specimen holder 4 on which the specimen 3 is held is moved to the exchange rod 10a of the specimen exchange device 10 from the support portion 5a of the holder support device 5 and transported into the specimen exchange chamber 9.

Then, the specimen holder 4 at the front-end portion of the exchange rod 10a is taken to the outside of the instrument from the specimen exchange chamber 9. Outside the instrument, the specimen 3 is released from the specimen holder 4 that has been taken out of the specimen exchange chamber 9. The specimen 3 is rotated through a desired angle in the specimen holder 4 by manual manipulation of the operator. Then, the specimen 3 is again held by the specimen holder 4. Under this condition, the specimen holder 4 holding the specimen 3 is inserted from outside the instrument into the specimen exchange chamber 9 and moved onto the front-end portion of the exchange rod 10a inside the exchange chamber 9.

The specimen holder 4 holding the rotated specimen 3 is then moved onto the support portion 5a of the holder support device 5 inside the microscope column 15 by the same procedure as the foregoing and supported there. The second observation is made.

An example of the prior art specimen holder 4 is shown in FIGS. 11 and 12. FIG. 11 is a plan view of the specimen holder 4. FIG. 12 is an exploded view of the holder 4, showing its structure.

As shown in FIG. 11, the prior art specimen holder 4 has a holder body 101 and a screw 103 (ring with external threads) for holding the specimen 3 onto the holder body 101.

As shown in FIG. 12, the holder body 101 of the specimen holder 4 is provided with a hole 101a for receiving and holding the specimen 3 therein. A step surface 101b is formed inside the hole 101a. The specimen 3 is received in the hole 101a formed in the holder body 101 and supported by the step surface 101b in the hole 101a. The specimen 3 is held inside the hole 101a in the holder body 101 by screwing the screw 103 into the hole 101a via a washer 102 having an opening 102a. The screw 103 is provided with an engaging opening 103a for rotating the screw 103. The screw 103 can be rotated after inserting a tool (not shown) for rotation such as a wrench into the engaging opening 103a. The outer surface of the screw 103 is threaded. The inner surface of the hole 101a formed in the holder body 101 is also threaded. The screw 103 is screwed into the hole 101a in the holder body 101 such that the threads on the screws fit over each other.

Where the second observation is made using the holder body 101 of the construction described above, the screw 103 of the holder body 101 is rotated in the direction to release the screw 103 after the end of the first observation. The screw is taken out of the hole 101a in the holder body 101. Then, the washer 102 is removed. Consequently, the specimen 3 is released inside the hole 101a of the holder body 101.

Then, the specimen 3 is rotated through a given angle inside the hole 101a of the holder body 101 by manual operation of the operator. At this time, the ti of a tool such as tweezers is brought into contact with the surroundings of the specimen 3. The tool is rotated and thus the specimen 3 is rotated. After manually rotating the specimen 3, the screw 103 is screwed and mounted into the hole 101a in the holder body 101 via the washer 102. Thus, the rotated specimen 3 is held in the hole 101a of the holder body 101. As a consequence, the specimen 3 that has been rotated through the given angle is held on the specimen holder 4.

The specimen holder 4 on which the rotated specimen 3 is held is moved and supported onto the support portion 5a of the holder support device 5 inside the microscope column 15. Then, the second observation is made.

When the second observation is made, if the specimen 3 is rotated by manual operation of the operator as described above, the screw 103 is taken out of the hole 101a in the holder body 101 whenever the specimen 3 is rotated. Then, the specimen holder 4 is disassembled. The specimen is rotated through a given angle. Then, the screw 103 is mounted into the hole 101a in the holder body 101. In this way, these operations are repeated. Much labor and time have been required. Hence, the efficiency is not high.

Furthermore, where the specimen 3 is a biological specimen, for example, the specimen holder 4 holding the specimen 3 therein may be cooled down to below −160° C., for example, to cover the specimen with non-crystalline ice having high transparency. Then, the specimen in a frozen state may be observed. In this case, the first observation is made while the specimen holder 4 is frozen together with the specimen 3. If the specimen holder 4 is then taken out of the instrument from the specimen exchange chamber 9 to rotate the specimen 3, the frozen specimen 3 and specimen holder 4 will be exposed to the atmosphere. The moisture in the atmosphere may frost the specimen 3. If the specimen 3 is once frosted in this way, the frost will remain on the specimen when the specimen 3 is transported into the microscope column 15 through the specimen exchange chamber 9 and the second observation is made. This makes it impossible to perform appropriate observations.

If the specimen 3 is rotated within a nitrogen ambient, for example, without exposing the specimen holder 4 to the atmosphere after the specimen holder 4 is taken out of the specimen exchange chamber 9, the possibility that the frozen specimen 3 is frosted decreases. However, if the temperature of the specimen 3 increases from −160° C. while the specimen 3 is being rotated, the ice that covers the specimen 3 may vary from non-crystalline to crystalline state. If the ice that covers the specimen 3 is crystallized, the transparency of the ice deteriorates, making it impossible to perform appropriate observations.

SUMMARY OF THE INVENTION

It is an object of the present invention to provide a specimen holder permitting a specimen to be rotated efficiently such that the specimen can be observed without hindrance. It is another object of the present invention to provide an observation system fitted with this specimen holder. It is a further object of the present invention to provide a method of rotating a specimen efficiently during observation of the specimen such that the observation is not hindered.

A specimen holder according to the present invention has a holder body provided with a hole having a step surface therein and a specimen-holding member having an opening for holding a specimen inside. The specimen-holding member is supported on the step surface in the hole of the holder body and placed within the hole. The step surface in the hole of the holder body is provided with at least one slot. The specimen-holding member has a surface to be supported. This supported surface has at least one first convex portion inserted in the slot.

An observation system according to the present invention has a source of a beam of charged particles, holder support means for supporting a specimen holder that holds a specimen, an illumination lens for controlling the beam of charged particles emitted by the source and for directing the beam at the specimen, image pickup means for taking a transmission image of the specimen, and an imaging lens for controlling the beam of charged particles transmitted through the specimen and projecting the beam onto the image pickup means.

The specimen holder supported by the holder support means has a holder body provided with a hole having a step surface therein and a specimen-holding member having an opening for holding the specimen inside. The specimen-holding member is supported on the step surface in the hole of the holder body and placed within the hole. The step surface in the hole of the holder body is provided with at least one slot. The specimen-holding member has a surface to be supported. This supported surface has at least one first convex portion inserted in the slot.

A method of rotating a specimen in accordance with the present invention uses a specimen holder having a specimen-holding member on which the specimen is held. This specimen-holding member has a convex portion. The method consists of rotating the specimen by moving the convex portion.

Another method of rotating a specimen in accordance with the present invention uses a specimen holder having a specimen-holding member on which the specimen is held. This specimen-holding member is provided with a recessed portion. The method consists of rotating the specimen by moving the recessed portion.

Other objects and features of the invention will appear in the course of the description thereof, which follows.

BRIEF DESCRIPTION OF THE DRAWINGS

FIG. 8 is a schematic view showing the front-end portion of another control rod according to the present invention.

FIG. 9 is a schematic view of a specimen holder according to a modified embodiment of the present invention;

DESCRIPTION OF THE PREFERRED EMBODIMENTS

Figure 1:
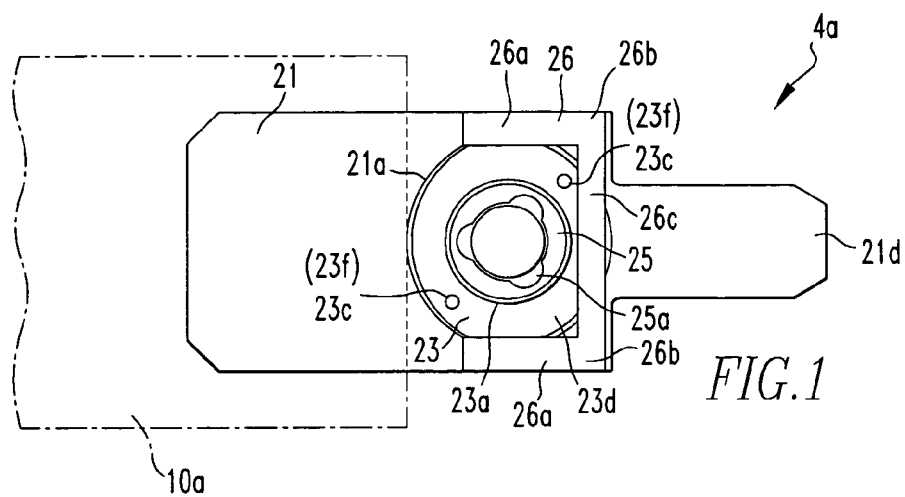
FIG. 1 is a plan view of a specimen holder according to the present invention.
Figure 2:
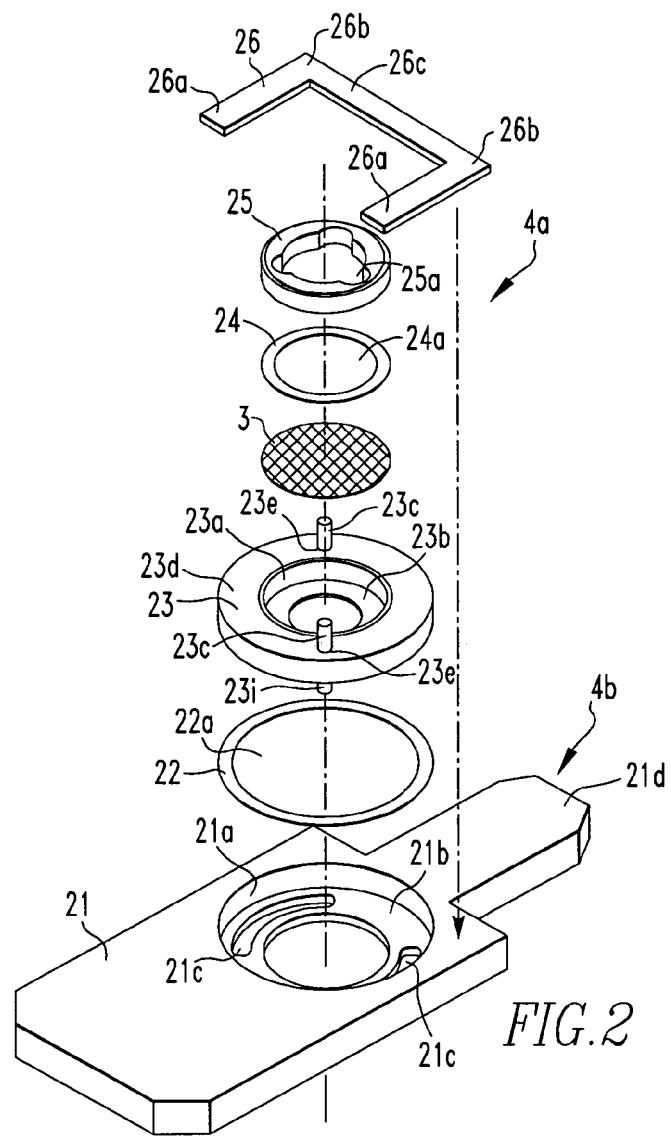
FIG. 2 is an exploded view of the specimen holder according to the present invention, showing the structure of the holder.

The preferred embodiments of the present invention are hereinafter described with reference to the accompanying drawings. FIG. 1 is a plan view of a specimen holder according to an embodiment of the present invention. FIG. 2 is an exploded view of this specimen holder, showing its structure.

Referring to FIG. 1, the specimen holder, indicated by reference numeral 4a, has a holder body 21, a specimen-holding member 23 for holding a specimen, a screw 25 for fixing the specimen to the specimen-holding member 23, and a leaf spring 26 for anchoring the specimen-holding member 23 to the holder body 21.

As also shown in FIG. 2, the holder body 21 of the specimen holder 4a is provided with a circular hole 21a for accommodating the specimen-holding member 23. A step surface 21b acting as a support surface is formed inside the circular hole 21a. Two opposite slots 21c are formed in the step surface 21b. The holder body 21 has a fitting portion 21d that is narrower than the diameter of the hole 21a.

The specimen-holding member 23 that is circular is received in the hole 21a of the holder body 21. The specimen-holding member 23 is placed and supported on the step surface 21b in the hole 21a of the holder body 21 via a first washer 22 having an opening 22a.

Two opposite through-holes 23e are formed in a surrounding portion 23d of the specimen-holding member 23. A rod-like member 23c made of a metal pin extends through each through-hole 23e. The rod-like member 23c is longer than the thickness of the surrounding portion 23d of the specimen-holding member 23. The rod-like member 23c has a lower-end portion 23i (also referred to as the first convex portion) and an upper-end portion 23f (also referred to as the second convex portion). The lower-end portion 23i and upper-end portion 23f protrude from the lower-end surface and opposite upper-end surface, respectively, of the surrounding portion 23d. The first convex portion 23i and second convex portion 23f are integral with the rod-like member 23c.

When the specimen-holding member 23 is received into the hole 21a in the holder body 21, the lower-end portions 23i of the two rod-like members 23c protruding from the lower-end surface of the surrounding portion 23d are inserted into the two slots 21c formed in the step surface 21b within the hole 21a. Since the lower surface of the surrounding portion 23d of the specimen-holding member 23 is placed and supported on the step surface 21b in the hole 21a of the holder body 21, this lower surface forms a supported surface. The first washer 22 is positioned between the step surface 21b and the lower surface. The first washer 22 is located outside the slots 21c on the step surface 21b.

The specimen-holding member 23 has an opening 23a. A step surface 23b is formed in the opening 23a. The specimen 3 is received in the opening 23a of the specimen-holding member 23. The specimen 3 is supported by the step surface 23b inside the opening 23a. The specimen 3 is held within the opening 23a of the specimen-holding member 23 by the screw 25 via a second washer 24 having an opening 24a. The screw 25 is provided with an engaging opening 25a used to rotate the screw 25. The screw 25 can be rotated by inserting a tool (not shown), such as a wrench, into the engaging opening 25a. The outer surface of the screw 25 is threaded. The inner surface of the opening 23a formed in the specimen-holding member 23 is also threaded. The screw 25 is screwed into the opening 23a in the specimen-holding member 23 such that these threads fit together.

The specimen 3 is held within the opening 23a by the screw 25. Consequently, the specimen-holding member 23 holding the specimen 3 is anchored to the holder body 21 by the leaf spring 26. This leaf spring 26 assumes a U-shaped form and consists of an elongate base portion 26c and two protruding portions 26a protruding from both end portions 26b of the base portion 26c. The both end portions 26b of the base portion 26c are welded to desired portions of the holder body 21 by spot welding or other technique while the surrounding portion 23d of the specimen-holding member 23 is held down by the base portion 26c and protruding portions 26a of the leaf spring 26. As a result, the specimen-holding member 23 is anchored to the holder body 21 while the specimen 3 is accommodated in the opening 23a.

The slots 21c formed in the step surface 21b within the hole 21a formed in the holder body 21 are shaped into a desired arc-shaped form. Especially, in the present embodiment, they assume the form of an arc corresponding to an internal angle of 90°. Accordingly, the lower-end portion 23i of the rod-like member 23c positioned on the surrounding portion 23d of the specimen-holding member 23 can loosely move along the contours of the slots 21c within the slots 21c. This permits the specimen-holding member 23 accommodated in the hole 21a of the holder body 21 to be rotated through 90° in conformity with the arc-shaped form of each slot 21c (i.e., corresponding to the internal angle of 90° C.). When the specimen holder 4a has been assembled, the upper-end portion 23f of the rod-like member 23c positioned on the surrounding portion 23d of the specimen-holding member 23 protrudes from the leaf spring 26 that fixes the specimen-holding member 23. Hence, the rod-like member 23c can be moved by bringing a jig or the like into contact with the upper-end portion 23f of the rod-like member 23c and applying an external force. Consequently, the specimen-holding member 23 can be rotated while received in the hole 21a of the holder body 21. The structure of the specimen holder 4a according to the present invention has been described so far. An observation system according to the present invention is described below.

The observation system, according to the present invention, is similar in structure with the transmission electron microscope already described in connection with FIG. 10. As shown in this figure, the transmission electron microscope (observation system) 1 is fitted with an electron gun 14 for emitting and accelerating an electron beam 12. The beam 12 is directed at the specimen 3 under control of an illumination lens 2. The specimen 3 is held on a specimen holder 4a. This specimen holder 4a is supported from the support portion 5a of a holder support device 5.

The electron beam 12 directed at the specimen 3 and transmitted through it is focused onto film 8 or image pickup means 13 consisting of a CCD camera 11 under control of an imaging lens 6. The image pickup means 13 can take and record a transmission image created from the specimen 3 by the electron beam 12. A fluorescent screen 7 is placed off the optical axis of the electron beam 12 during imaging.

The electron gun 14, illumination lens 2, holder support device 5, and imaging lens 6 are positioned within the microscope column 15. A specimen exchange chamber 9 is mounted at a side of the microscope column 15 and located opposite to the holder support device 5. A specimen exchange device 10 having an exchange rod 10a for moving the specimen holder 4 into the microscope column 15 is mounted in the specimen exchange chamber 9. The inside of the microscope column 15 and the inside of the specimen exchange chamber 9 can be pumped down to a given degree of vacuum by vacuum pumping systems (not shown).

Figure 3:
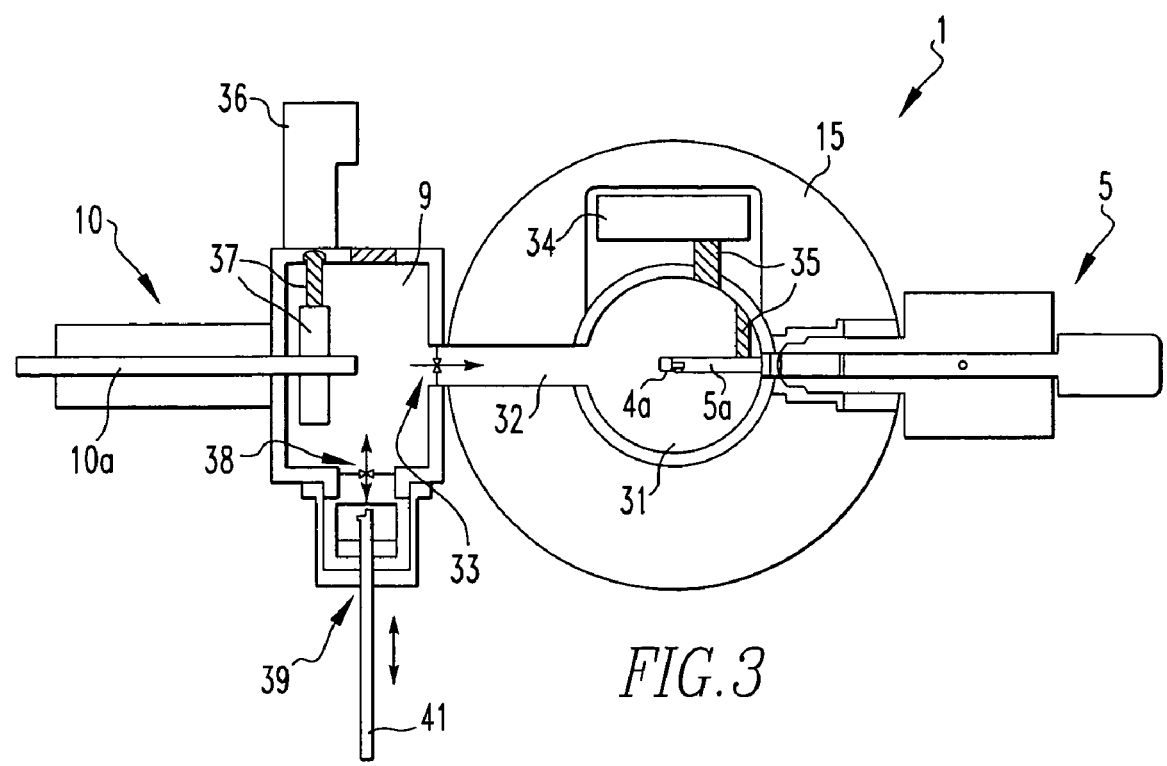
FIG. 3 is a cross-sectional view taken on line A—A of FIG. 10.
Figure 10:
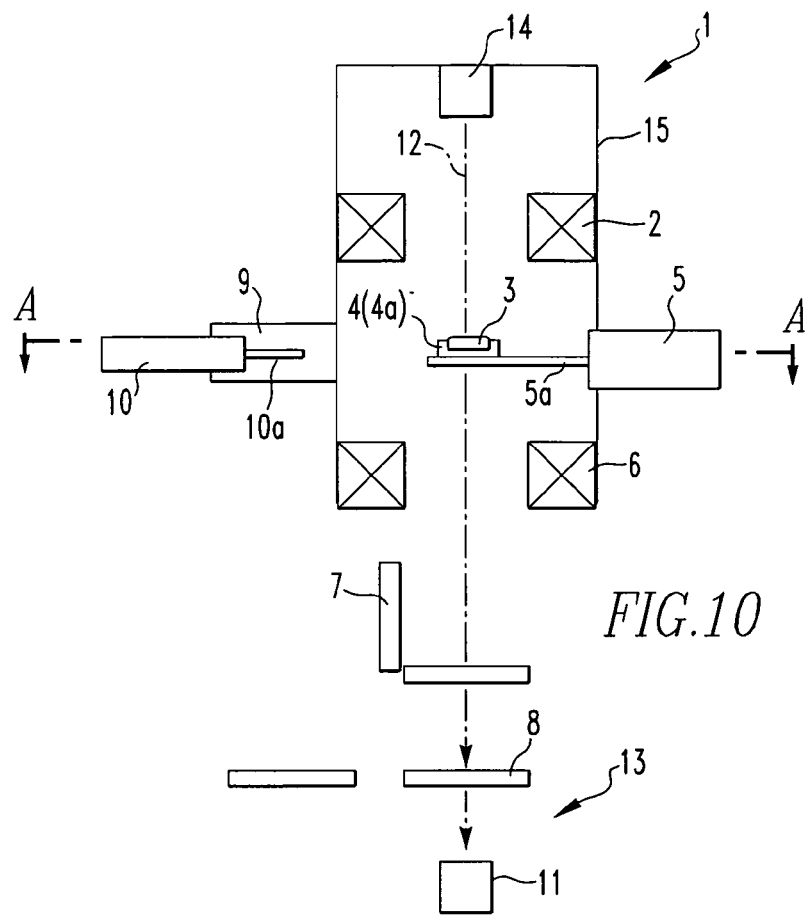
FIG. 10 is a schematic view of a transmission electron microscope.
Figure 11:
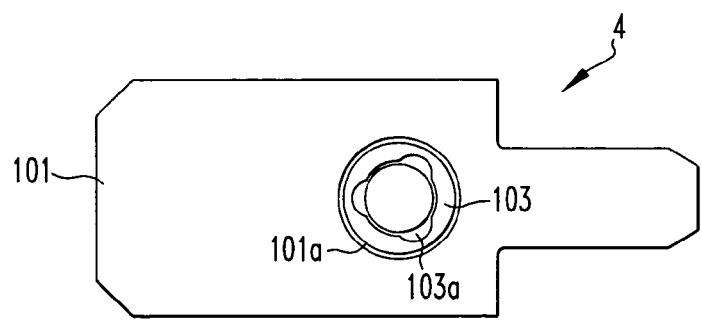
FIG. 11 is a plan view of the prior art specimen holder.
Figure 12:
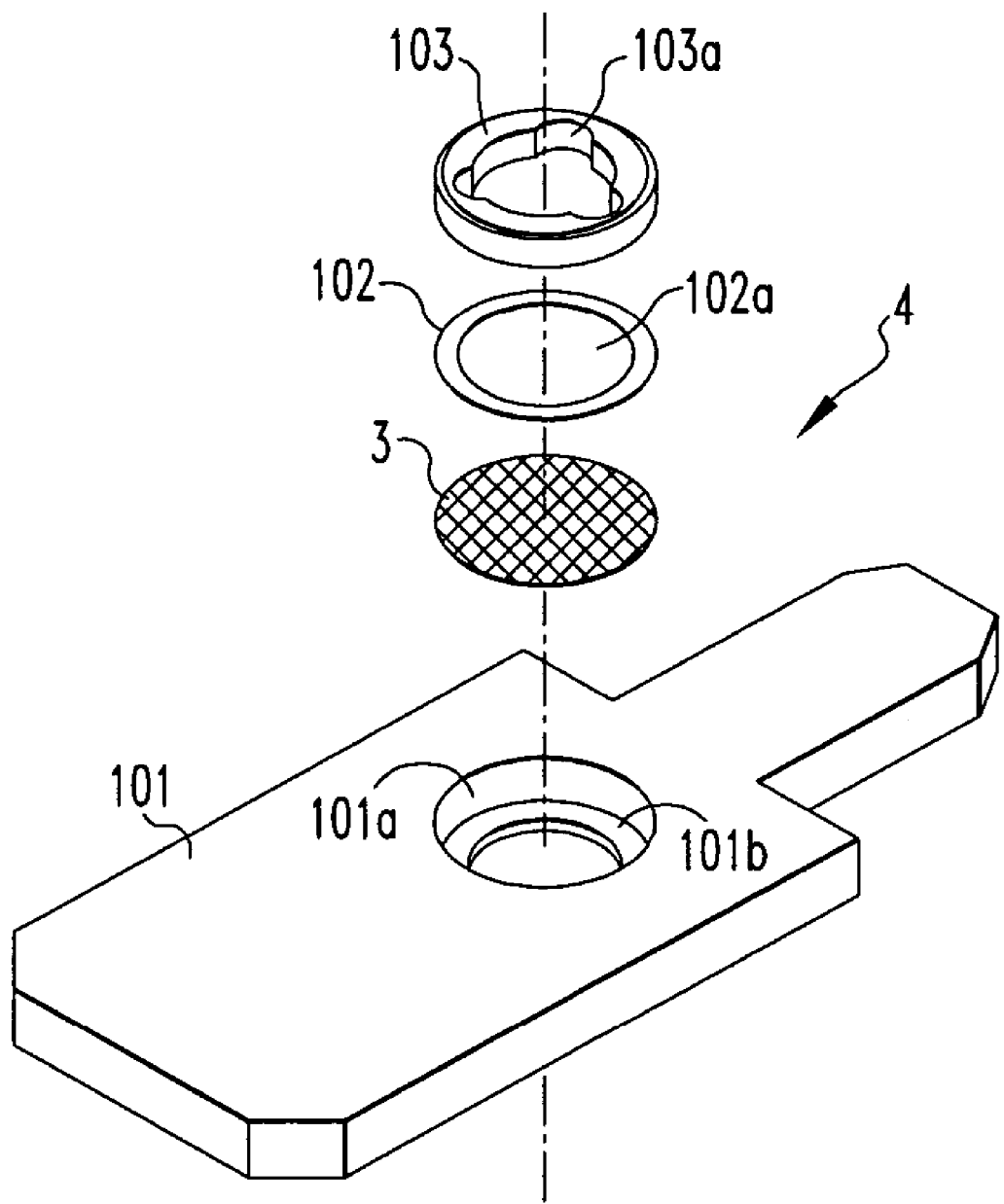
FIG. 12 is an exploded view of the prior art specimen holder, showing the structure of the holder.

FIG. 3 is a cross-sectional view taken on line A—A of FIG. 10. As shown in this figure, the specimen exchange chamber 9 is mounted at a side of the microscope column 15 and located opposite to the holder support device 5 positioned in the microscope column 15. The specimen holder 4a is supported from the front-end portion of the support portion 5a of the holder support device 5 in the center of a beam path 31 in which the electron beam 12 passes. The beam path 31 and specimen exchange chamber 9 are in communication with each other via a specimen transfer passage 32 and a first opening and closing valve 33. This valve 33 is mounted in the specimen exchange chamber 9. The inside of the beam path 31 within the microscope column 15, the inside of the specimen transfer passage 32, and the inside of the specimen exchange chamber 9 can be pumped down to given degrees of vacuum.

The support portion 5a of the holder support device 5 is cooled by a cooling source 34 via a heat transfer member 35. A liquid nitrogen tank holding liquid nitrogen, for example, is used as the cooling source 34. Thus, the support portion 5a of the holder support device 5 is cooled to below −160° C.

The exchange rod 10a of the specimen exchange device 10 mounted in the specimen exchange chamber 9 is cooled by a cooling source 36 via a heat transfer member 37. A liquid nitrogen tank holding liquid nitrogen, for example, is also used as this cooling source 36. Consequently, the exchange rod 10a of the specimen exchange device 10 is also cooled to below −160° C.

A second opening and closing valve 38 for communication with the outside of the instrument is mounted in the specimen exchange chamber 9. The specimen transport device 39 is detachably mounted while facing the second opening and closing valve 38.

Figure 4:
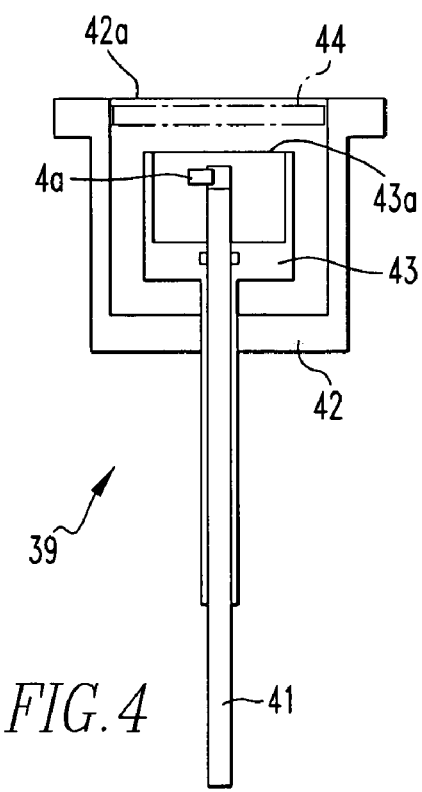
FIG. 4 is a schematic view of a specimen transport device according to the present invention.

The structure of the specimen transport device 39 is shown in FIG. 4. As shown in this figure, the transport device 39 has an outer case 42 provided with a transport port 42a, a partition plate 44 for closing off the transport port 42a in the outer case 42, an inner case 43 disposed inside the outer case 42 and having a transport port 43a, and a transport rod 41 slidably extending through both side walls of the outer case 42 and inner case 43. The transport rod 41 extends through the side walls of the cases 42 and 43 in positions opposite to the transport ports 42a and 43a, respectively, in the cases 42 and 43. In FIG. 4, the specimen holder 4a holding the specimen 3 is placed at the front-end portion of the transport rod 41. The specimen holder 4a placed at the front-end portion is frozen and transported to the front-end portion of the exchange rod 10a located within the specimen exchange chamber 9.

The specimen holder 4a transported to the exchange rod 10a located inside the specimen exchange chamber 9 has been frozen at below −160° C. while holding the specimen 3 in this way. A method of freezing the specimen 3 is described below.

The single specimen 3 is placed inside a specimen freezer (not shown). The second washer 24 and screw 25 of the components of the specimen holder 4a shown in FIG. 2 are also placed inside the freezer such that the specimen 3, washer 24, and screw 25 are located separately. These parts are cooled and frozen. The specimen freezer is fitted with a liquid nitrogen tank and can freeze the specimen 3 and the above-described constituent members placed inside the freezer below −160° C.

The specimen-holding member 23 is received in the hole 21a of the holder body 21 of the components of the specimen holder 4a shown in FIG. 2 via the first washer 22. A subassembly 4b for holding the specimen is previously assembled. The specimen-holding member 23 is anchored by the leaf spring 26 to this subassembly 4b. The holding subassembly 4b is placed at the front-end portion of the transport rod 41 in the specimen transport device 39 shown in FIG. 4.

Then, the partition plate 44 of the specimen transport device 39 is removed, and the transport port 42a in the outer case 42 of the specimen transport device 39 is mounted in the in/out port of the specimen freezer. After opening the opening and closing valve for the in/out port, the transport rod 41 of the specimen transport device 39 is pushed in to move the holding subassembly 4b placed at the front-end portion of the transport rod 41 into the specimen freezer.

In the specimen freezer, the specimen 3, second washer 24, and screw 25 have been previously frozen at −160° C. The frozen specimen 3, second washer 24, and screw 25 are received in this order into the opening 23a in the specimen-holding member 23 of the holding subassembly 4b within the specimen freezer by manual operation or work of the operator. At this time, it follows that the screw 25 is screwed into the opening 23a. Thus, the specimen 3 is held in the opening 23a. When the screw 25 is screwed into the opening 23a, the lower-end portions of the rod-like members 23c positioned on the specimen-holding member 23 are inserted in the slots 21c formed in the step surface 21b within the hole 21a formed in the holder body 21. Under this condition, the lower-end portions of the rod-like members 23c are anchored to the ends of the slots 21c. Consequently, the specimen-holding member 23 does not rotate if the screw 25 rotates. The screw 25 is appropriately screwed into the hole 21a of the holder body 21.

Because the screw 25 is screwed into the hole 21a of the holder body 21, the frozen specimen 3 is mounted in the opening 23a. The specimen holder 4a (see FIG. 2) is placed at the front-end portion of the transport rod 41 of the specimen transport device 39. Under this condition, the specimen holder 4a is assembled. The specimen holder 4a to which the specimen 3 has been mounted is frozen below −160° C. inside the specimen freezer.

Then, the transport rod 41 of the specimen transport device 39 is pulled out of the specimen freezer. The specimen holder 4a that is placed at the front-end portion of the transport rod 41 and has been frozen together with the specimen 3 is received inside the inner case 43 of the specimen transport device 39. The transport port 42a of the outer case 42 of the specimen transport device 39 is taken out of the in/out port of the specimen freezer, and the partition plate 44 is mounted to the specimen transport device 39.

The specimen transport device 39 which has been taken out of the in/out port of the specimen freezer and to which the partition plate 44 has been mounted is immediately mounted to face the second opening and closing valve 38 of the specimen exchange chamber 9 as shown in FIG. 3. The second opening and closing valve 38 is closed. Before the specimen transport device 39 is mounted in the specimen exchange chamber 9, the partition plate 44 is removed from the specimen transport device 39. In FIG. 3, the specimen holder 4a holding the specimen 3 is supported by the support portion 5a of the holder support device 5 in the microscope column 15 for carrying out observations. Therefore, the specimen holder 4a is not placed at the front-end portion of the transport rod 41 of the specimen transport device 39.

As described previously, the specimen transport device 39 is mounted in the specimen exchange chamber 9 so as to face the second opening and closing valve 38 of the specimen exchange chamber 9 and then the insides of the outer case 42 and inner case 43 of the specimen transport device 39 are pumped down to a given degree of vacuum by vacuum pumping means (not shown) while the second opening and closing valve 38 is closed. The inside atmospheres of the cases 42 and 43 of the specimen transport device 39 reach the given degree of vacuum that is comparable to the degree of vacuum of the inside atmosphere of the specimen exchange chamber 9. Then, the second opening and closing valve 38 of the specimen exchange chamber 9 is opened. The transport rod 41 of the specimen transport device 39 is pushed in to move the specimen holder 4a placed at the front-end portion of the transport rod 41 into the specimen exchange chamber 9. Consequently, the specimen holder 4a placed at the front-end portion of the transport rod 41 is transferred to the front-end portion of the exchange rod 10a of the specimen exchange device 10 inside the specimen exchange chamber 9.

After the specimen holder 4a has been transferred to the exchange rod 10a, the transport rod 41 of the specimen transfer device 39 is pulled out of the specimen exchange chamber 9. The second opening and closing valve 38 in the specimen exchange chamber 9 is closed.

In the specimen exchange chamber 9, the specimen holder 4a is moved to the front-end portion of the exchange rod 10a of the specimen exchange device 10, and then the first opening and closing valve 33 of the specimen exchange chamber 9 is opened. The front-end portion of the exchange rod 10a is moved into the beam path 31 inside the microscope column 15 via the specimen transfer passage 32. As a result, the specimen holder 4a transferred to the front-end portion of the exchange rod 10a is moved to the front-end portion of the support portion 5a of the holder support device 5 and supported there inside the beam path 31 of the microscope column 15. Then, the exchange rod 10a is pulled out of the beam path 31 inside the microscope column 15 through the specimen transfer passage 32. The first opening and closing valve 33 in the specimen exchange chamber 9 is closed.

In this way, the specimen holder 4a holding the specimen 3 is transported and supported from the front-end portion of the support portion 5a of the holder support device 5 inside the beam path 31. Under this state, the aforementioned first observation is made under given conditions.

After the end of the first observation, the first opening and closing valve 33 of the specimen exchange chamber 9 is opened. The front-end portion of the exchange rod 10a of the specimen exchange device 10 is pushed out into the beam path 31 within the microscope column 15 via the specimen transfer passage 32 in the same way as the foregoing. Thus, the specimen holder 4a supported from the front-end portion of the support portion 5a of the holder support device 5 is transported to the front-end portion of the exchange rod 10a of the specimen exchange device 10 inside the beam path 31 within the microscope column 15. Then, the front-end portion of the exchange rod 10a is pulled out of the beam path 31 inside the microscope column 15 through the specimen transfer passage 32. The first opening and closing valve 33 in the specimen exchange chamber 9 is closed.

Consequently, the specimen holder 4a holding the specimen 3 that has undergone the first observation is placed in the specimen exchange chamber 9. Subsequent rotation of the specimen 3 is carried out inside the specimen exchange chamber 9. The procedure and method for this rotation of the specimen 3 is described below.

After or before the first observation, the specimen transport device 39 is taken out of the specimen exchange chamber 9 when the specimen holder 4a is placed within the specimen exchange chamber 9. A jig 50 (as shown in FIG. 5) for rotating the specimen is mounted in the specimen exchange chamber 9 so as to face the second opening and closing valve 38 in the specimen exchange chamber 9.

Figure 5:
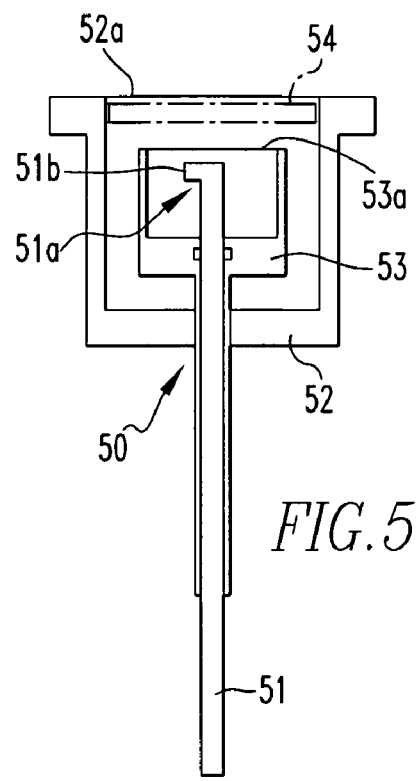
FIG. 5 is a schematic view of a specimen-rotating jig according to the present invention.

As shown in FIG. 5, the jig 50 for rotating the specimen has an outer case 52 provided with a transport port 52a, a partition plate 54 for closing the outer case 52, an inner case 53 positioned inside the outer case 52 and provided with a transport port 53a, and a control rod 51 slidably extending through both side walls of the outer case 52 and inner case 53. The rod 51 extends through the side walls of the cases 52 and 53 at positions facing the transport ports 52a and 53a, respectively, in the cases 52 and 53. The rod 51 has a front-end portion 51a having a protruding portion 51b projecting perpendicularly to the longitudinal direction of the rod 51. In FIG. 5, the protruding portion 51b projects to the left relative to the longitudinal direction (up-and-down direction as viewed in FIG. 5) of the rod 51.

Figure 6:
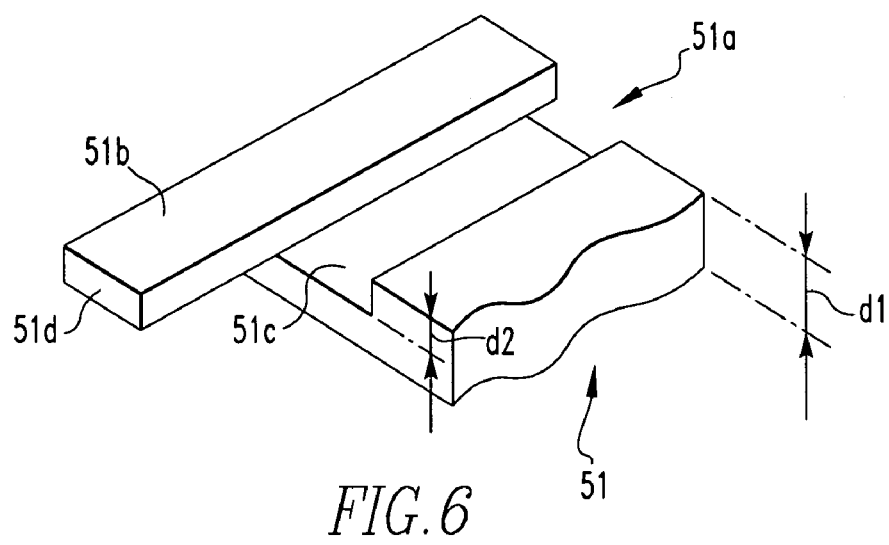
FIG. 6 is an expanded perspective view of the front-end portion of a control rod included in the specimen-rotating jig according to the present invention.

FIG. 6 is an expanded perspective view of the front-end portion 51a of the control rod 51. As shown in this figure, the protruding portion 51b having an abutting surface 51d extending in a direction perpendicular to the longitudinal direction of the rod 51 is formed on the front-end portion 51a. A groove 51c extending in the longitudinal direction of the protruding portion 51b is formed also on the front-end portion 51b. The depth d2 of the groove 51c is set about half, for example, of the thickness d1 of the front-end portion 51a of the control rod 51. The protruding portion 51b is mounted to cover a part of the groove 51c that is located on the front-end side of the control rod 51.

As described above, when the jig 50 for rotating the specimen is mounted in the specimen exchange chamber 9 so as to face the second opening and closing valve 38 of the chamber 9, the partition plate 54 is withdrawn from the jig 50. After mounting the jig 50 for rotation in the specimen exchange chamber 9 in this way, the insides of the outer case 52 and inner case 53 of the jig 50 are pumped down to a given degree of vacuum by the vacuum pumping means (not shown) while the second opening and closing valve 38 is closed. After the inner atmospheres of the cases 52 and 53 of the jig 50 have reached the given degree of vacuum comparable to the degree of vacuum of the inner atmosphere of the specimen exchange chamber 9, the second opening and closing valve 38 of the specimen exchange chamber 9 is opened. The control rod 51 of the jig 50 for rotating the specimen is pushed in to force the front-end portion 51a of the control rod 51 into the specimen exchange chamber 9.

At this time, the exchange rod 10a in the specimen exchange device 10 has been pulled into its limit position. The specimen holder 4a shifted to the front-end portion of the exchange rod 10a is further off the given specimen holder exchange position within the specimen exchange chamber 9 toward the specimen exchange device 10. Therefore, the front-end portion 51a of the control rod 51 moved into the specimen exchange chamber 9 of the specimen holder 4a is placed between the specimen holder 4a and first opening and closing valve 33 and close to the specimen holder 4a without contacting the holder 4a transferred to the front-end portion of the exchange rod 10a.

Figure 7A:
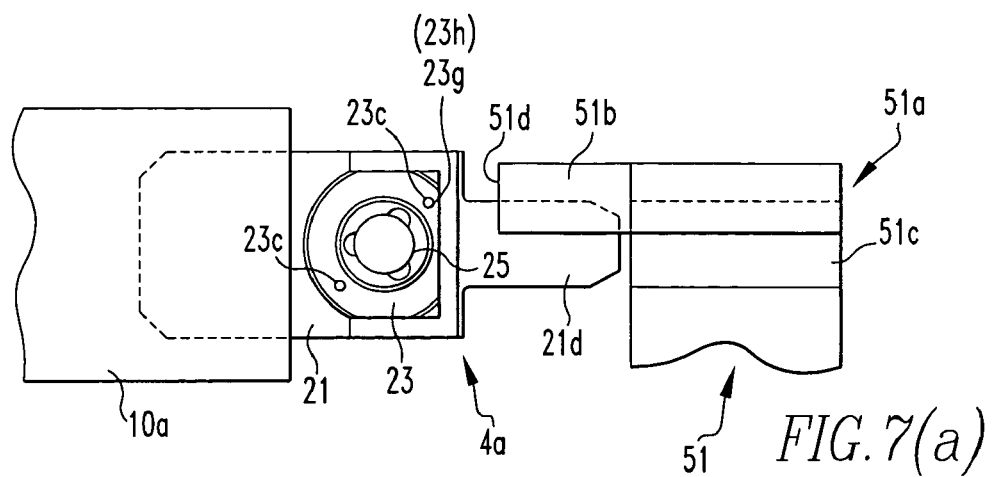
FIGS. 7(a)–7(c) are plan views illustrating the various steps of a method of rotating a specimen in accordance with the present invention.
Figure 7B:
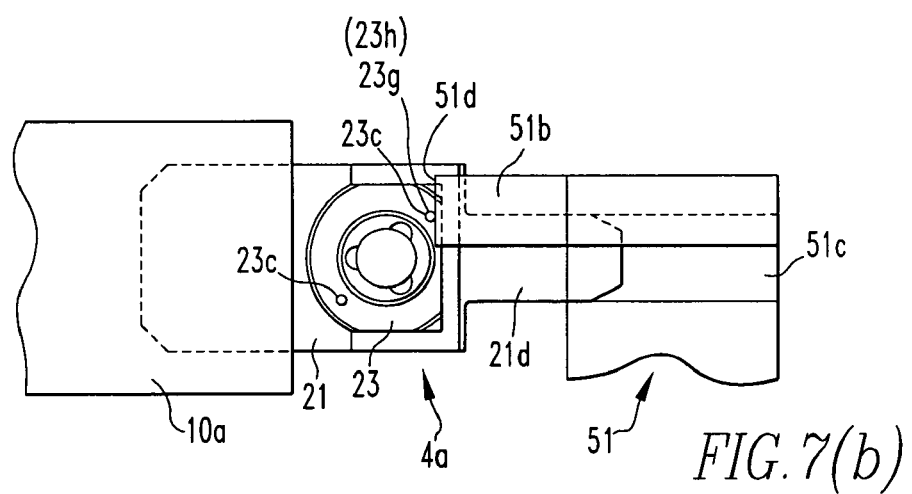
Figure 7C:
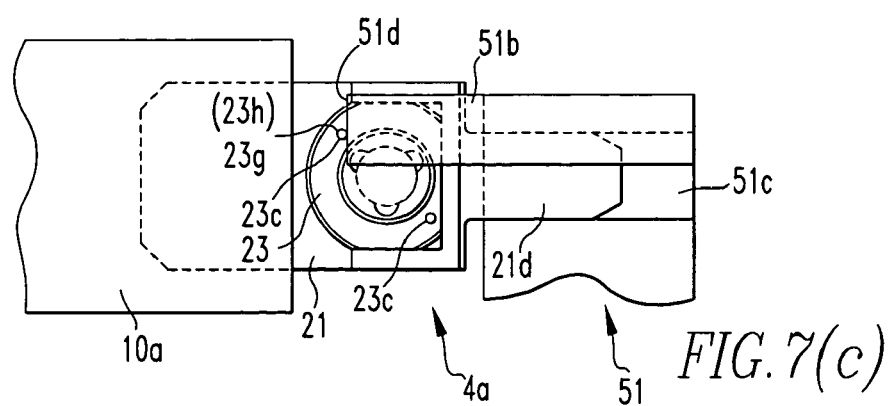

The method of rotating the specimen 3 in the specimen exchange chamber 9 is described in further detail by referring to FIGS. 7(a)–7(c), which are plan views illustrating the steps of the method of rotating the specimen 3.

FIG. 7(a) shows the state in which the front-end portion 51a of the control rod 51 is located close to the specimen holder 4a as described above. The protruding portion 51b formed on the front-end portion 51a of the control rod 51 juts toward the position of the specimen holder 4a. At this time, the abutting surface 51d of the protruding portion 51b is located opposite to the upper-end portion (second convex portion) 23h of one rod-like member 23g of the two rod-like members 23c positioned on the specimen-holding member 23 in the specimen holder 4a. The fitting portion 21d of the holder body 21 of the specimen holder 4a is opposite to the groove 51c formed in the front-end portion 51a of the control rod 51.

Then, the exchange rod 10a holding the specimen holder 4a by its front-end portion is moved a slight distance from the limit position toward the first opening and closing valve 33 (not shown in FIGS. 7(a)–7(c) to the right as viewed in FIGS. 7(a)–7(c). As a result, as shown in FIG. 7(b), the specimen holder 4a moves together with the moving exchange rod 10a. This brings the upper-end portion 23h of the above-described one rod-like member 23g in the specimen-holding member 23 of the specimen holder 4a into abutting engagement with the abutting surface 51d of the protruding portion 51b of the control rod 51. At this time, the front end of the fitting portion 21d of the holder body 21 fits into the groove 51c in the front-end portion 51a of the control rod 51.

If the movement of the exchange rod 10a is continued, the fitting portion 21d fits into the groove 51c in the longitudinal direction of the groove. Concomitantly, the upper-end portion 23h of the aforementioned one rod-like member 23g is pushed while kept in abutting engagement with the abutting surface 51 of the protruding portion 51b. Since the upper-end portion 23h continues to be pushed, the one rod-like member 23g and its upper-end portion 23h move. At this time, the lower-end portions 23i of both rod-like members 23c including the one rod-like member 23g are loosely slidable along the slots 21c formed in the step surface 21b within the hole 21a formed in the holder body 21. As mentioned previously, the slots 21c are arc-shaped in a corresponding manner to the inner angle of 90° in this embodiment. Therefore, as the one rod-like member 23g is pushed, both rod-like members 23c move along the contours of the arcs. Consequently, as shown in FIG. 7(c), the specimen-holding member 23 of the specimen holder 4a rotates through an angle of 90°. The specimen 3 held to the specimen-holding member 23 is also rotated through an angle of 90° C.

After the specimen-holding member 23 of the specimen holder 4a rotates as shown in FIG. 7(c), the exchange rod 10a of the specimen exchange device 10 is once pulled into the position shown in FIG. 7(a). Then, the front-end portion 51a of the control rod 51 is pulled out of the specimen exchange chamber 9.

In the same way as the foregoing, the first opening and closing valve 33 of the specimen exchange chamber 9 is opened. The front-end portion of the exchange rod 10a is moved into the beam path 31 within the microscope column 15 through the specimen transfer passage 32. As a consequence, the specimen holder 4a that is located at the front-end portion of the exchange rod 10a and holds the rotated specimen 3 is moved and supported from the front-end portion of the support portion 5a of the holder support device 5 in the beam path 31 within the microscope column 15. Then, the exchange rod 10a is pulled out of the beam path 31 within the microscope column 15 through the specimen transfer passage 32. The first opening and closing valve 33 in the specimen exchange chamber 9 is closed.

The specimen holder 4a holding the specimen 3 is placed and supported on the front-end portion of the support portion 5a of the holder support device 5 inside the beam path 31. Under this condition, the second observation is made under given conditions.

After the second observation, if the operator wants to make an observation of the specimen in the same rotational position as in the first observation by rotating the specimen 3 through 90° in the reverse direction to regain the state obtained when the first observation was made, a jig fitted with a control rod 59 shown in FIG. 8 and used for rotation may be employed. This control rod 59 has a front-end portion 59a provided with a protruding portion 59b at a given distance from the front-end surface 59c. The abutting surface of the protruding portion 59b is placed in a position where the surface abuts against the upper-end portion of the other rod-like member of the two rod-like members 23c positioned on the specimen-holding member 23.

A modified embodiment of the present invention is shown in FIG. 9. Also, in this modified embodiment, rod-like members (invisible in FIG. 9 because they are hidden by the specimen-holding member 23) extend through two through-holes 23e formed in the specimen-holding member 23 received in the hole 21a formed in the holder body 21 of the specimen holder 4a. The upper openings (recessed portions) 23j of the through-holes 23e are exposed. In particular, in the above embodiment, the rod-like members 23c extend through the through-holes 23e. In contrast, in this modified embodiment, the rod-like members are shorter. The lower-end portions (first convex portions) of the rod-like members protrude from the lower openings of the through-holes 23e. When the specimen-holding member 23 is received in the hole 21a formed in the holder body 21, the lower-end portions of the rod-like members are inserted into the two slots 21c formed in the step surface 21b within the hole 21a.

A specimen-rotating mechanism 60 shown in FIG. 9 is mounted in an upper part of the inside of the specimen exchange chamber 9 (see FIG. 3). This mechanism 60 has a rotary base 62, a rotating shaft 63 rotatably holding the rotary base 62, and a rotary driver 64 for pivotally rotating the rotating shaft 63. The base 62 has two fitting pins 61. When the specimen-holding member 23 holding the specimen 3 is rotated, the specimen-rotating mechanism 60 is lowered in the specimen exchange chamber 9. Thus, the two fitting pins 61 of the specimen-rotating mechanism 60 are fitted into the upper openings 23j of the through-holes 23e formed in the specimen-holding member 23. Then, the positions of the upper openings 23j of the through-holes 23e are moved via the fitting pins 61 by rotating the rotary base of the specimen-rotating mechanism 60. In this manner, the specimen-holding member 23 holding the specimen 3 is rotated.

In this way, in the present invention, after the end of the first observation, the specimen is rotated within the specimen exchange chamber without taking the specimen holder to the outside of the instrument from the specimen exchange chamber. Then, the second observation can be made. Consequently, the specimen holder is not disassembled when the specimen is rotated. Hence, rotation of the specimen can be done efficiently.

Furthermore, during rotation of the specimen, the specimen holder holding the specimen is not exposed to the atmosphere. Therefore, where the specimen holder is cooled to below −160° C., for example, together with the specimen and frozen, the specimen is prevented from becoming frosted. As a consequence, the second observation can be performed appropriately.

Moreover, during rotation of the specimen frozen as described above, the specimen temperature is prevented from increasing above −160° C. Therefore, the ice that covers the specimen does not vary from its non-crystalline state. Hence, the second observation can be made appropriately.

Having thus described my invention with the detail and particularity required by the Patent Laws, what is desired protected by Letters Patent is set forth in the following claims.

The invention claimed is:

1. An observation system having a source of a beam of charged particles, holder support means for supporting a specimen holder that holds a specimen, an illumination lens for controlling the beam of charged particles emitted by the source and for directing the beam at the specimen, image pickup means for taking a transmission image of the specimen, and a focusing lens for controlling the beam of charged particles transmitted through the specimen and projecting the beam onto the image pickup means, wherein
  (A) the specimen holder supported by the holder support means has a holder body provided with a hole having a step surface therein and a specimen-holding member having an opening for holding the specimen inside, the specimen-holding member being supported on the step surface in the hole of the holder body and placed within the hole,
  (B) the step surface in the hole of the holder body is provided with at least one slot,
  (C) the specimen-holding member has a surface to be supported, and
  (D) the supported surface has at least one first convex portion inserted in the slot.

2. The observation system set forth in claim 1, wherein plural slots are formed in the step surface in the hole of the holder body of the specimen holder and convex portions formed on the supported surface of the specimen-holding member are identical such that the convex portions correspond to the slots, respectively.

3. The observation system set forth in any one of claim 1 or 2, wherein the slot or slots formed in the step surface in the hole of the holder body of the specimen holder is/are arc-shaped.

4. The observation system set forth in claim 3, wherein first and second convex portions of the specimen-holding member of the specimen holder are made integral by rod-like members extending through the specimen-holding member.

5. The observation system set forth in any one of claim 1 or 2, wherein a second convex portion is formed on a surface of the specimen-holding member of the specimen holder that is on an opposite side of the supported surface.

6. The observation system set forth in claim 5, further comprising a specimen exchange chamber having a jig for rotating the specimen, said jig having a rod with a protruding portion to contact with the second convex portion of the specimen-holding member and to rotate the specimen-holding member.

7. The observation system set forth in any one of claim 1 or 2, wherein a recessed portion is formed in a surface of the specimen-holding member of the specimen holder that is on an opposite side of the supported surface.

8. The observation system set forth in claim 7, further comprising a specimen exchange chamber having a specimen-rotating mechanism, said mechanism having a rotating shaft with a fitting pin to be fitted into the recessed portion of the specimen-holding member and to rotate the specimen-holding member.

* * * * *